(12) United States Patent
Ehrler et al.

(10) Patent No.: US 11,454,654 B2
(45) Date of Patent: Sep. 27, 2022

(54) METHOD FOR EVALUATING THE STATE AND THE QUALITY OF LOW-VOLTAGE NETWORKS

(71) Applicant: DEHN SE + CO KG, Neumarkt/Opf. (DE)

(72) Inventors: Jens Ehrler, Neumarkt (DE); Peter Zahlmann, Neumarkt (DE); Ralph Brocke, Ilmenau/Oberpörlitz (DE)

(73) Assignee: DEHN SE, Neumarkt i.d.Opf (DE)

( * ) Notice: Subject to any disclaimer, the term of this patent is extended or adjusted under 35 U.S.C. 154(b) by 0 days.

(21) Appl. No.: 16/968,757

(22) PCT Filed: Jan. 31, 2019

(86) PCT No.: PCT/EP2019/052306
§ 371 (c)(1),
(2) Date: Aug. 10, 2020

(87) PCT Pub. No.: WO2019/166174
PCT Pub. Date: Sep. 6, 2019

(65) Prior Publication Data
US 2020/0408816 A1    Dec. 31, 2020

(30) Foreign Application Priority Data

Feb. 27, 2018  (DE) .................... 10 2018 104 462.3
Jun. 13, 2018  (DE) .................... 10 2018 114 181.5

(51) Int. Cl.
*G01R 19/25*  (2006.01)
*H02J 13/00*  (2006.01)
*G01R 21/133*  (2006.01)

(52) U.S. Cl.
CPC .... *G01R 19/2513* (2013.01); *H02J 13/00028* (2020.01); *G01R 21/133* (2013.01)

(58) Field of Classification Search
CPC .. G01R 19/2513; G01R 19/30; G01R 21/133; G01R 23/165; G01R 23/167;
(Continued)

(56) References Cited

U.S. PATENT DOCUMENTS 10,074,973 B2    9/2018  Durth et al.
11,072,323 B2 *  7/2021  Lassenberger ........ B60W 10/26
(Continued)

FOREIGN PATENT DOCUMENTS

DE    102004022719 A1    12/2005    ............. G01R 19/00
DE    102004022719 B4     9/2007    ............. G01R 19/00
(Continued)

OTHER PUBLICATIONS

Helvatron, "UMD 705". Full text available at: https://www.helvatron.com/en/products/fronteinbau-und-netzqualitatsanalyse/umd-705-2/ (last accessed on Nov. 12, 2020).
(Continued)

*Primary Examiner* — Giovanni Astacio-Oquendo
(74) *Attorney, Agent, or Firm* — Bodner & O'Rourke, LLP; Gerald T. Bodner; Christian P. Bodner

(57) ABSTRACT

The invention relates to a method for evaluating the state and the quality of low-voltage networks, in the branched system of which there is a plurality of connected loads, by determining network measurement data by means of power quality measuring and testing devices and transferring the network measurement data, by means of a standard interface, to a control system or in retrievable form to a server. According to the invention, the overvoltage protection devices, which are or can be used in the low-voltage system and have a self-diagnosis unit and an existing wireless or wired standard interface for data transfer, are able to determine network measurement data by means of integrated or adapted power quality measuring and testing devices.

5 Claims, 1 Drawing Sheet

(58) Field of Classification Search
CPC .... G01R 23/145; H02J 13/00028; H02J 3/01; H02H 9/04; H02H 9/044
USPC .................................... 324/76.11, 200, 227
See application file for complete search history.

(56) References Cited

U.S. PATENT DOCUMENTS

| | | | | |
|---|---|---|---|---|
| 2009/0091429 | A1* | 4/2009 | Myoung | H04B 3/54 |
| | | | | 375/258 |
| 2009/0187284 | A1* | 7/2009 | Kreiss | G06Q 50/06 |
| | | | | 700/297 |
| 2010/0070213 | A1 | 3/2010 | Anklam | 702/60 |
| 2010/0142601 | A1 | 6/2010 | Flowers et al. | 375/222 |
| 2011/0057517 | A1* | 3/2011 | Zhang | H02J 3/01 |
| | | | | 307/105 |
| 2015/0092459 | A1* | 4/2015 | Bergdahl | H02J 3/01 |
| | | | | 363/39 |
| 2016/0225562 | A1* | 8/2016 | Franks | H02H 3/006 |
| 2017/0168656 | A1* | 6/2017 | Teachman | G01R 19/2506 |
| 2018/0001788 | A1* | 1/2018 | Geuß | B60L 53/50 |
| 2019/0207387 | A1 | 7/2019 | Brocke et al. | |
| 2020/0326363 | A1* | 10/2020 | sun | H02H 1/0092 |
| 2021/0044100 | A1* | 2/2021 | Angelosante | H02H 3/08 |

FOREIGN PATENT DOCUMENTS

| | | | | |
|---|---|---|---|---|
| DE | 102006034164 | A1 | 11/2007 | H01R 9/26 |
| DE | 102006034164 | B4 | 7/2008 | H01R 9/26 |
| DE | 202012010818 | U1 | 11/2012 | H02J 13/00 |
| DE | 102012025178 | A1 | 5/2014 | G01D 21/02 |
| DE | 102013018482 | A1 | 11/2014 | G01D 21/00 |
| DE | 102014219913 | A1 | 4/2016 | H02H 9/04 |
| DE | 102016125900 | A1 | 3/2018 | H02H 9/04 |
| EP | 2478607 | B1 | 11/2013 | H02J 3/24 |
| KR | 20160028336 | A | 3/2016 | G06Q 50/10 |
| KR | 101755560 | B1 | 7/2017 | G06Q 50/10 |
| WO | WO2011032579 | A1 | 3/2011 | H02J 3/24 |
| WO | WO2013132292 | A1 | 9/2013 | G06Q 50/00 |
| WO | WO2016091239 | A1 | 6/2016 | G01R 19/25 |

OTHER PUBLICATIONS

The Notification Concerning Transmittal of International Preliminary Report on Patentability (Chapter I of the Patent Cooperation Treaty), in English, dated Sep. 3, 2020, which was issued by the International Bureau of WIPO in Applicant's corresponding international PCT application having Serial No. PCT/EP2019/052306, filed on Jan. 31, 2019.

The English translation of the International Preliminary Report on Patentability (Chapter I of the Patent Cooperation Treaty), dated Aug. 27, 2020, which was issued by the International Bureau of WIPO in Applicant's corresponding international PCT application having Serial No. PCT/EP2019/052306, filed on Jan. 31, 2019.

The Written Opinion of the International Searching Authority, in English, dated May 10, 2019, which was issued by the International Bureau of WIPO in Applicant's corresponding international PCT application having Serial No. PCT/EP2019/052306, filed on Jan. 31, 2019.

The International Search Report, in English, dated May 10, 2019, which was issued by the International Bureau of WIPO in Applicant's corresponding international PCT application having Serial No. PCT/EP2019/052306, filed on Jan. 31, 2019.

* cited by examiner

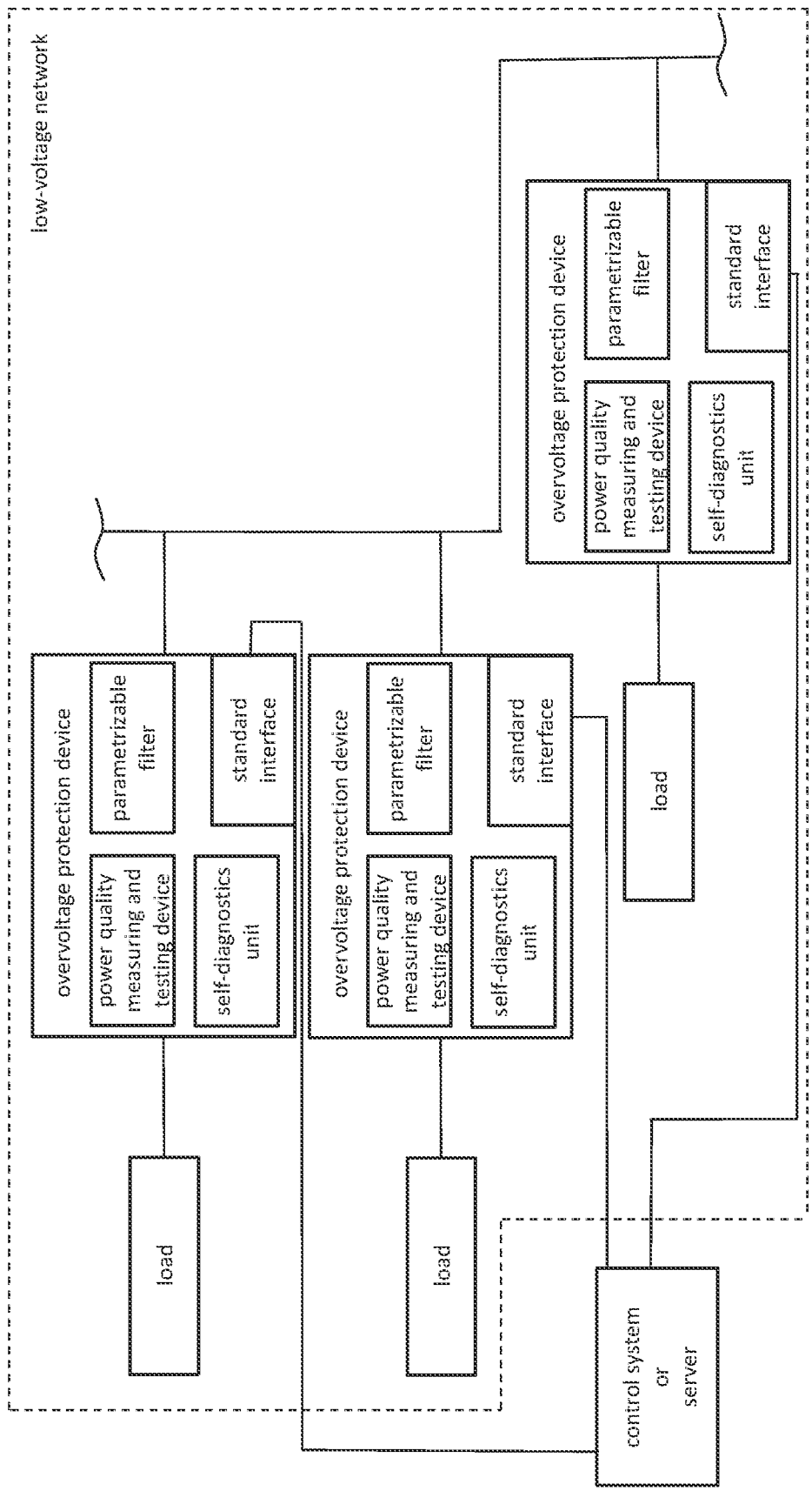

METHOD FOR EVALUATING THE STATE AND THE QUALITY OF LOW-VOLTAGE NETWORKS

The invention is based on a method for evaluating the state and the quality of low-voltage networks, in the branched system of which a plurality of connected loads is located, by determining network measurement data by means of power quality measuring and testing devices and transferring the network measurement data by means of an interface to a control system or in retrievable form to a server, according to the preamble of claim 1.

From DE 10 2006 034 164 B4, a multi-pole lightning current arrester and/or overvoltage arrester in series clamping implementation are/is already known. This overvoltage arrester preferably serves for protecting devices and installations of information technology and is composed of a base part formed as a feed-through terminal, and plug-in modules, which can be inserted into the base part and have protective elements for top hat rail assembly.

According to an embodiment therein, a circuit board is provided, which has a means for wireless fault and state monitoring, for example, in the form of an RFID transponder. The circuit board can also include means for monitoring the temperature of the protective elements located on the remaining circuit boards. Such means may be temperature sensors each located close to, in particular opposite the protective elements.

In this respect, the known overvoltage arrester depicted above thus has a self-diagnosis unit.

In the smart meter according to DE 20 2012 010 818 U1, the meter has electronics for detecting the current consumption and for outputting data representing the current consumption via a data communication interface.

According to a preferred embodiment, a LAN interface for reading out and programming the smart meter is provided, while at least one further interface and the electronics of the smart meter are arranged to serve for controlling other external devices which, for example, via a field bus system, may then be controlled by the smart meter likewise connected to the field bus system.

There is also the possibility to integrate a web server into the housing of the smart meter so that the current consumption of external devices, for example, also of mobile phones, which is determined by the smart meter may be retrieved via a suitable software over the Internet.

The overvoltage protection device with the monitoring function according to DE 10 2014 219 913 A1 has a special switching arrangement in the kind of a Wheatstone measuring bridge so as to recognize the state of the overvoltage protection elements present there immediately in time.

For controlling the state, temporary but also periodically repeating measurements may be made alternatively or additionally.

Local signalizing of the state may be performed, for example, by an optical and/or acoustic signal or a display. Remote signalizing may be realized by remote signaling, for example, via an automation bus or generally by means of telecommunication.

From WO 2016/091239 A1, a measuring and/or testing device and a method for measuring and/or estimating the quality or the stability of power supply networks are/is already known. It is pointed out in this publication that due to new, distributed generator units for providing electrical energy, network disturbances occur in many cases due to lacking measuring devices for detecting the quality of voltage. A locally fed network requires a minimum amount of likewise decentralized measuring and controlling means so as to be able to operate the network in a stable and efficient manner and to recognize and remove disturbances of the supply quality (power quality) in final consumer households. In this respect, WO 2016/091239 A1 proposes a measuring and/or testing device designed to comprise mains tapping means and a power supply unit, which is equipped with a unit having at least one AD converter circuit for continuously scanning, digitizing and forwarding of at least voltage and/or frequency values of the mains voltage via an interface. A microcontroller unit serves for processing and/or converting data and is in communication with the measuring and/or testing device.

As far as the method is concerned, determining of mains measurement data, forwarding the measurement data via a first, local data connection of an internal microcontroller unit or an IT device, processing and/or editing or else evaluating the data in the microcontroller unit and/or the IT device as well as providing the data with a timestamp and a location marking are now performed. Subsequently, the data items are forwarded via a second data connection to a computer center and/or a further IT device and/or a storage medium. In the computer center or on the part of the energy supplier, an evaluation of the data may then be made and, if necessary, an intervention into the network be performed.

In EP 2 478 607 B1, a method for monitoring an electrical energy supply network is proposed, in which at least at two different measurement points in the energy supply system a detection of measurement values characterizing the state of the energy supply network is performed. To each measurement value, a time stamp indicating the point of time of its detection is assigned. Moreover, a threshold value consideration by means of a reference value is performed. Likewise, a statistical evaluation and transmission of the data to a control center facility of the energy supply network takes place.

DE 10 2013 018 482 A1 shows a method and a device for automatically characterizing and monitoring an electrical network or a power supply portion of an electrical network or an electric system. The aim of the teaching therein is to be able to make decisions beforehand for avoiding failures and/or to automatically execute required switching operations or other countermeasures.

In this respect, a network value, measurement and monitoring system as well as a mathematical evaluation of a plurality of the initial measurement values is built up so as to initiate the network quality assuring measures hereinafter by means of empirical values.

In the data collection method for the quality evaluation of electrical energy according to DE 10 2004 022 719 B4, an anticipative identification and rapid removal of quality disturbances is intended to be achieved. Using the network's information, values are determined at certain points of detection by means of voltage and current converters for detecting momentary currents and voltages and are digitized by means of A/D converters.

By means of relevant, quality determining parameters, a mathematically determined comparison of incoming measurement data to characteristic or standard values is performed in order to define the network quality from them.

Moreover, network quality measurement devices, also designed for top hat rail installation are known. By way of example, the device UMD 705 of company Helvatron should be mentioned here (see www.helvatron.com/de/power-quality/umd-705).

Summarizing, it is known from the state of the art to check, by means of a measuring and testing technology already available on the market, the quality of a low-voltage network, to process the collected data items and to provide them to the energy supplier via a control system. Corresponding measuring and testing devices, however, need to be integrated at as many points of the network as possible in a very complex manner and to be electrically connected there. Moreover, possibilities for data transmission from such measuring and testing devices to the control system need to be created. All of the aforementioned measures, however, are associated with a considerable effort and additional costs.

From the aforementioned, it is therefore a task of the invention to propose a further developed method for evaluating the state and the quality of low-voltage networks, in which a plurality of connected loads is located, in which network measurement data items are determined and, in doing so, use is made of power quality measuring and testing devices known per se.

BRIEF DESCRIPTION OF THE SEVERAL VIEWS OF THE DRAWINGS(S)

The FIGURE is a block diagram that shows the general structure of the low-voltage network with the upgraded overvoltage protection devices as obtained in the method according to the present invention.

The solution of the task of the invention is performed by the teaching of claim 1, with the dependent claims representing at least appropriate configurations and further developments.

Accordingly, the overvoltage protection devices employed and already existing or employable in the low-voltage system, which have a self-diagnosis unit and a wireless or wired standard interface, are upgraded in a manner according to the invention by means of integrated or adapted power quality measuring and testing devices for determining network measurement data.

The already intended versatile employment of such upgraded overvoltage protection devices at most different points of the low-voltage system allows a network state map to be established. The network state data resulting therefrom in a location and time relation are provided and can be retrieved by the network operator. Already today, it can be expected that an overvoltage protection device is present at least in each building. If an entire low-voltage system is considered, a multitude of overvoltage arresters has to be expected which prevail in the network quasi in the manner of a swarm. With the upgrading of these already existing or still to be employed overvoltage protection devices for determining network measurement data, a new quality of prevailing or permeating the network is given so that not only the network quality can be judged but there is also the possibility of adapting the protective level of the overvoltage protection devices, for example, when switching operations occur in the network. In doing so, there is the possibility of considering the low-voltage system as being divided into single sub-networks and to obtain, for example, in case of a network in an industrial environment, data for the network operator, which can cause him to differentiate the supply and remuneration in such an industrial environment as compared to network systems in purely residential areas. Such an analysis of network systems gains importance in particular by the increase of the number and the use of electric vehicles which regularly have to drive to mains powered charging stations.

In the spirit according to the invention, the possibilities for wireless or wired data transmission existing in overvoltage protection devices are thus utilized in order to provide, for example, apart from self-diagnosis data of the overvoltage protection devices, the mentioned power quality measuring and testing data obtained by corresponding devices for the state analysis.

In a manner according to the invention, the preferably employed overvoltage protection devices are already provided with a power quality measuring and testing device. The function for network quality determination integrated within the overvoltage arrester is released or requested manually or via a data command.

For example, if signs of bad network quality accumulate in a known local area within the network state map, the local resolution can be increased by switching on further, previously not activated overvoltage protection devices having an integrated power quality measuring and testing device, and it can be identified which connected load currently is the cause for network troubles. These may be, for example, voltage drops, increased development of harmonic waves, undesired phase shift or similar.

To this effect, the network state map comprises indications as to the harmonic wave spectrum, wherein data items for adapting parameterizable filters are derived from the harmonic wave spectra.

This adaptation of existing parameterizable filters is performed in a timely manner by bidirectional data transmission and standard interfaces correspondingly realized to be bidirectional so that network breakdowns or network failures are avoidable.

Finally, a statistical evaluation and long-term consideration of the respectively monitored network(s) may be performed on the basis of the network state map, which comprises location-related and time-related data, in order to derive measures for a uniform network utilization, and to provide these to the consumers but also the network operators, so that finally the possibility is given to work out a price model for energy suppliers, which is dynamic and structured with a view to optimizing the network quality.

At least a part of the consumer-oriented overvoltage protection devices is parameterizable or is provided with active parametrizable filters, so that a distributed filter system is the result in the low-voltage network. This distributed filter system is fed with information about the respective harmonic wave spectrum, in order to subsequently improve the network quality by adapting the decentralized filters.

As already mentioned, the data transmission is performed preferably bidirectionally, so that by starting from data of the respectively current network state map, properties of the overvoltage protection devices relative to the need of protection such as response voltage, set values for the overcurrent protection function, short-circuit currents in the network and similar are dynamically parameterizable.

The data items of the network state map are made available, for example, via an Internet portal and can be called up with the aid of application software.

The teaching according to the invention is aimed at determining information that is not connected to the original function of overvoltage protection devices, and to transmit it over a standard interface to a superordinate control system or a user application software. This special information is related to network-typical properties such as harmonic waves, voltage drops or similar, which may be derived from power quality modules. Such power quality modules will be integrated into the overvoltage protection devices or may be attached and electrically connected in a simple manner to an overvoltage protection device as an adapter arrangement.

An advantage of the function integration implemented in this way is that separate devices are not required to be installed and an additional communication channel is not required to be created.

A particular advantage of the method according to the invention is that, starting from the basic function of overvoltage protection devices, these are present at a multitude of points in the network and therefore distributed in the network. For example, overvoltage protection devices are also employed in the supply main distribution and can determine at this point information about the network quality in the entire downstream system.

The method according to the invention creates also the possibility for various overvoltage protection devices upgraded in such a manner to communicate. Thus, as a consequence of a determined harmonic wave spectrum, an adaptation of active filters, for example, with respect to a connected load, may be performed. Hereby, the harmonic wave spectrum in the entire low-voltage system can be influenced positively. The fact that there is the possibility of also decentralizing parameterizable filters by a decentralized arrangement of the overvoltage protection devices, results in an advantageous alternative to the otherwise usual installation of centralized filter units. Arrangements having distributed filters in a network system can react more quickly and, in terms of costs, are also more advantageous as compared to a centralized unit.

The invention claimed is:

1. A method for evaluating a state and a quality of low-voltage networks, in a branched system of which a plurality of connected loads is located, by determining network measurement data by means of power quality measuring and testing devices and transferring the network measurement data by means of an interface to a control system or in retrievable form to a server,
   wherein overvoltage protection devices employed or employable in the low-voltage network are upgraded to be upgraded overvoltage protection devices for determining network measurement data,
   the overvoltage protection devices having a self-diagnosis unit and a wireless or wired standard interface for data transmission,
   wherein the overvoltage protection devices are upgraded by means of integrated or adapted power quality measuring and testing devices,
   wherein due to the versatile comprehensive employment of the upgraded overvoltage protection devices at most different points of the low-voltage network, a network state map is established, and network state data resulting therefrom in a location and time relation are kept available and can be retrieved by a network operator or supplier.

2. The method according to claim 1,
   wherein the network state map comprises indications as to an harmonic wave spectrum, wherein data items for adapting parameterizable filters are derived from determined harmonic wave spectra.

3. The method according to claim 2,
   wherein at least a part of consumer-oriented overvoltage protection devices is provided with active parameterizable filters, so that a distributed filter system results in the low-voltage network, which distributed filter system is fed with information about the respective harmonic wave spectrum, in order to subsequently improve the network quality by adapting the decentralized parametrizable filters.

4. The method according to claim 1,
   wherein the data transmission is performed bidirectionally, so that by starting from data of the respectively current network state map, properties of the overvoltage protection devices relative to a need of protection such as response voltage, set values for an overcurrent protection function and short-circuit currents in the network are dynamically parameterizable.

5. The method according to claim 1,
   wherein data items of the network state map are held ready by being made available on an Internet portal and an application software in a continuously updated manner and so as to be retrievable.

* * * * *